(12) United States Patent
Taketsu et al.

(10) Patent No.: US 8,810,740 B2
(45) Date of Patent: Aug. 19, 2014

(54) ILLUMINATION OPTICAL SYSTEM AND IMAGE DISPLAY APPARATUS

(75) Inventors: Iori Taketsu, Saitama (JP); Koji Kita, Kanagawa (JP); Tomoki Ono, Kanagawa (JP); Tetsuya Kita, Kanagawa (JP)

(73) Assignee: Sony Corporation, Tokyo (JP)

( * ) Notice: Subject to any disclaimer, the term of this patent is extended or adjusted under 35 U.S.C. 154(b) by 125 days.

(21) Appl. No.: 13/533,196

(22) Filed: Jun. 26, 2012

(65) Prior Publication Data

US 2013/0010215 A1 Jan. 10, 2013

(30) Foreign Application Priority Data

Jul. 6, 2011 (JP) .................................. 2011-150077

(51) Int. Cl.
*G02F 1/1335* (2006.01)

(52) U.S. Cl.
USPC .............................................................. 349/8

(58) Field of Classification Search
CPC ............ G02F 1/1335; G02F 1/133526; G02F 1/13357; G02F 1/29; G02B 19/0057; G02B 27/0961; G02B 27/0905; G02B 27/0025; G02B 27/0966; G02B 3/0037; G03B 21/14; G03B 21/2033; H01S 5/4012; H01S 5/4093; H04N 9/3129; H04N 9/3161; H04N 9/3197; H04N 9/3164; H04N 9/3167; Y10S 85/901; F21V 5/04

USPC .................. 349/8, 9, 61, 62, 113, 95; 355/67; 362/244, 259, 553, 257, 559; 359/251, 359/626; 385/33, 34, 901; 353/31
See application file for complete search history.

(56) References Cited

FOREIGN PATENT DOCUMENTS

| DE | 197 51 106 | 5/1998 |
|---|---|---|
| JP | 2006-5015 | 1/2006 |
| JP | 2009-192789 | 8/2009 |

*Primary Examiner* — Thoi Duong
(74) *Attorney, Agent, or Firm* — Frommer Lawrence & Haug LLP; William S. Frommer

(57) ABSTRACT

An illumination optical system includes a two-dimensional laser-array light source including a plurality of laser light sources arranged in a two-dimensional array on a plane; an integrator optical system configured to superpose incident light and emit the light to an irradiated surface; a plurality of first lenses disposed parallel to the plane and configured to superpose beams from the two-dimensional laser-array light source in a first axis direction and emit the beams to the integrator optical system while limiting a divergence angle in the first axis direction of the two-dimensional array; and a plurality of second lenses disposed rearward of the first lenses and configured to superpose the beams from the two-dimensional laser-array light source in a second axis direction orthogonal to the first axis direction and emit the beams to the integrator optical system while limiting a divergence angle in the second axis direction.

8 Claims, 10 Drawing Sheets

ILLUMINATION OPTICAL SYSTEM AND IMAGE DISPLAY APPARATUS

BACKGROUND

The present technique relates to an illumination optical system and an image display apparatus.

Front projectors (projection apparatuses) are a type of image display apparatus. A front projector includes a discharge lamp, which is used as a light source, and a reflective liquid crystal display device, a transmissive liquid crystal device, or a digital micromirror device (DMD), which is used as a light modulation device. Various improvements have been made in the devices and optical systems.

Recently, the use of laser as a new light source of an image display apparatus has been proposed. A laser beam is emitted from a significantly small emitting region. The luminance of the beam is highest at the center and rapidly decreases toward the periphery of the emitting region, developing a luminance distribution that is substantially a Gaussian distribution. Thus, the light from illumination optical systems that include laser devices as light sources can be used as illumination with a uniform distribution only when the luminance is made uniform. Such illumination optical systems have been proposed (for example, refer to Japanese Unexamined Patent Applications Publication Nos. 2006-5015 and 2009-192789).

SUMMARY

The proposed illumination optical systems are one-dimensional laser-array light sources and disadvantageous in that their size is increased as a result of the increased number of devices for generating a large amount of light.

The present technique has been conceived in light of such circumstances and provides an illumination optical system and an image display apparatus having an illumination optical system, the illumination optical system being small in size even when the number of included devices, i.e., light sources, is increased.

To solve the problem described above, an illumination optical system includes a two-dimensional laser-array light source, an integrator optical system, a plurality of first lenses, and a plurality of second lenses. The two-dimensional laser-array light source includes a plurality of laser light sources arranged in a two-dimensional array on a plane. The integrator optical system is configured to superpose incident light and emit the light to an irradiated surface. The plurality of first lenses is disposed parallel to the plane and is configured to superpose beams from the two-dimensional laser-array light source in a first axis direction and emit the beams to the integrator optical system while limiting a divergence angle in the first axis direction of the two-dimensional array. The plurality of second lenses is disposed rearward of the first lenses and is configured to superpose the beams from the two-dimensional laser-array light source in a second axis direction orthogonal to the first axis direction and emit the beams to the integrator optical system while limiting a divergence angle in the second axis direction.

To solve the problem described above, an image display apparatus includes a light modulation device, a two-dimensional laser-array light source, an integrator optical system, a plurality of first lenses, and a plurality of second lenses. The two-dimensional laser-array light source includes a plurality of laser light sources arranged in a two-dimensional array on a plane. The integrator optical system is configured to superpose incident light and emit the light to the light modulation device. The plurality of first lenses is disposed parallel to the plane and is configured to superpose beams from the two-dimensional laser-array light source in a first axis direction and emit the beams to the integrator optical system while limiting a divergence angle in the first axis direction of the two-dimensional array. The plurality of second lenses is disposed rearward of the first lenses and is configured to superpose the beams from the two-dimensional laser-array light source in a second axis direction orthogonal to the first axis direction and emit the beams to the integrator optical system while limiting a divergence angle in the second axis direction.

The illumination optical system and image display apparatus described above have a small illumination optical system even with an increased number of devices, which are the light sources.

DETAILED DESCRIPTION OF EMBODIMENTS

Figure 1:
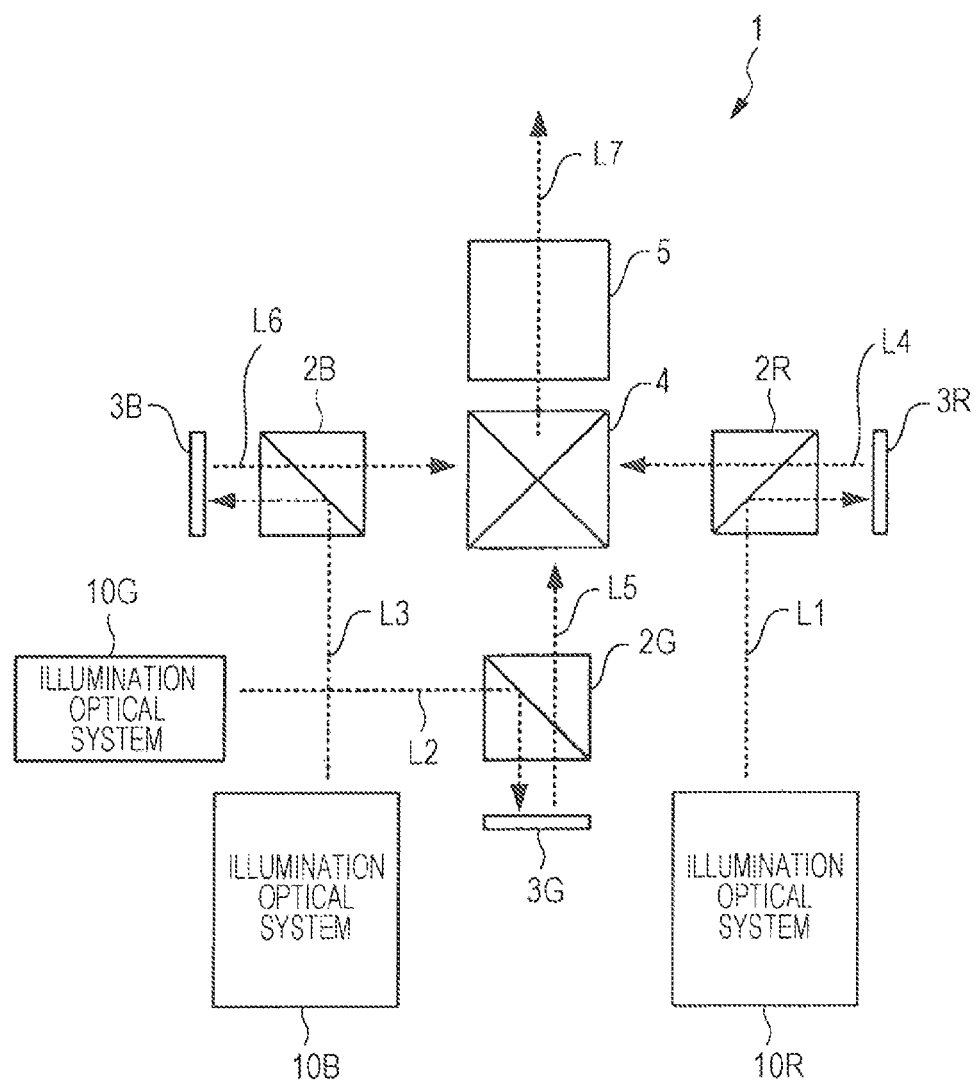
FIG. 1 illustrates an example configuration of an image display apparatus according to a first embodiment.

Embodiments of the present technique will be described below in detail with reference to the drawings.
First Embodiment An image display apparatus according a first embodiment will be described, in outline, below with reference to FIG. 1. FIG. 1 illustrates an example configuration of the image display apparatus according to the first embodiment.

The image display apparatus 1 outputs, for display, an image combining light-modulated images of red, green, and blue (RGB). The image display apparatus 1 is, for example, a projection apparatus, such as a front projector or a rear projector.

The image display apparatus 1 includes illumination optical systems 10R, 10G, and 10B, reflective polarizing elements 2R, 2G, and 2B, light modulation devices 3R, 3G, and 3B, a color combining prism 4 (combining optical system), and a projection lens 5 (projection optical system).

The illumination optical systems 10R, 10G, and 10B are illumination optical systems having two-dimensional laser-array light sources corresponding to the colors R, G, and B, respectively. For example, the illumination optical system 10R has a two-dimensional laser-array light source corresponding to red. The illumination optical system 10G has a two-dimensional laser-array light source corresponding to green. The illumination optical system 10B has a two-dimensional laser-array light source corresponding to blue.

In the illumination optical system 10R, light (L1) emitted from the two-dimensional laser-array light source is converted to light having a uniform illuminance distribution and is incident on the light modulation device 3R, which is an irradiated surface. In the illumination optical system 10G, light (L2) emitted from the two-dimensional laser-array light source is converted to light having a uniform illuminance distribution and is incident on the light modulation device 3G, which is an irradiated surface. In the illumination optical system 10B, light (L3) emitted from the two-dimensional laser-array light source is converted to light having a uniform illuminance distribution and is incident on the light modulation device 3B, which is an irradiated surface.

The RGB beams from the illumination optical systems 10R, 10G, and 10B are reflected at the corresponding reflective polarizing elements 2R, 2G, and 2B and are incident on the corresponding light modulation devices 3R, 3G, and 3B. The light modulation devices 3R, 3G, and 3B light-modulate and reflect the RGB beams, respectively.

The RGB beams light-modulated at the corresponding light modulation devices 3R, 3G, and 3B are optically compensated (fine control of phase modulation level) at optical compensation devices (not shown) and then enter the corresponding reflective polarizing elements 2R, 2G, and 2B. Depending on the light modulation level, a part of the RGB beams incident on the reflective polarizing elements 2R, 2G, and 2B is transmitted to the color combining prism 4, and the other part is reflected and returns to the corresponding illumination optical systems 10R, 10G, and 10B.

The color combining prism 4 transmits incident light in a green wavelength band and reflects, toward the projection lens 5, incident light in red and blue wavelength bands. The color combining prism 4 is constituted of, for example, a plurality of glass prisms (four prisms shaped as substantially the same isosceles right triangles) bonded together. Two interference filters, which have predetermined optical characteristics, are disposed on the bonding surface of each glass prisms. A first interference filter reflects incident light in a blue wavelength band and transmits incident light in red and green wavelength bands. A second interference filter reflects incident light in a red wavelength band and transmits incident light in green and blue wavelength bands. Thus, the color combining prism 4 combines the light (L4) from the light modulation device 3R, the light (L5) from the light modulation device 3G, and the light (L6) from the light modulation device 3B and emits the combined light to the projection lens 5.

The projection lens 5 magnifies the combined light (L7) from the color combining prism 4 by a predetermined magnification and projects the magnified image on a screen (not shown).

The light modulation device may be a reflective liquid-crystal device, a transmissive liquid-crystal-display device, or a digital micromirror device (DMD).

Figure 2:
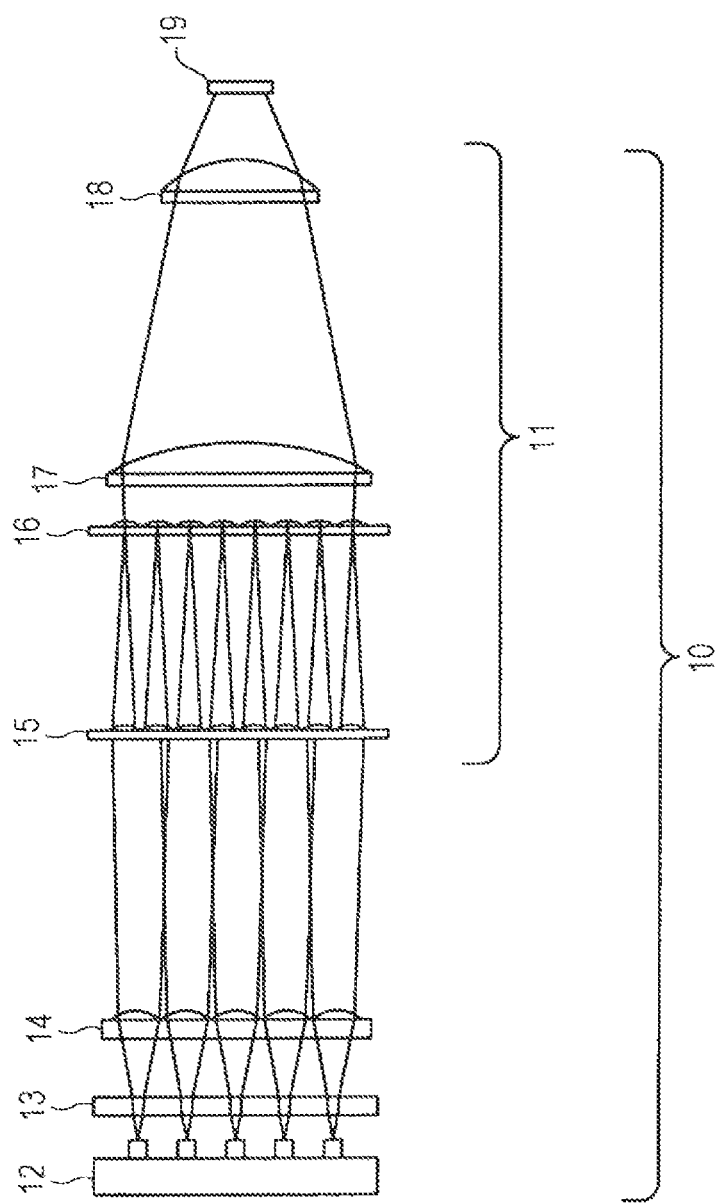
FIG. 2 illustrates an example configuration of the illumination optical system according to the first embodiment projected on a first plane.
Figure 2:
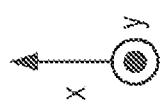
Figure 3:
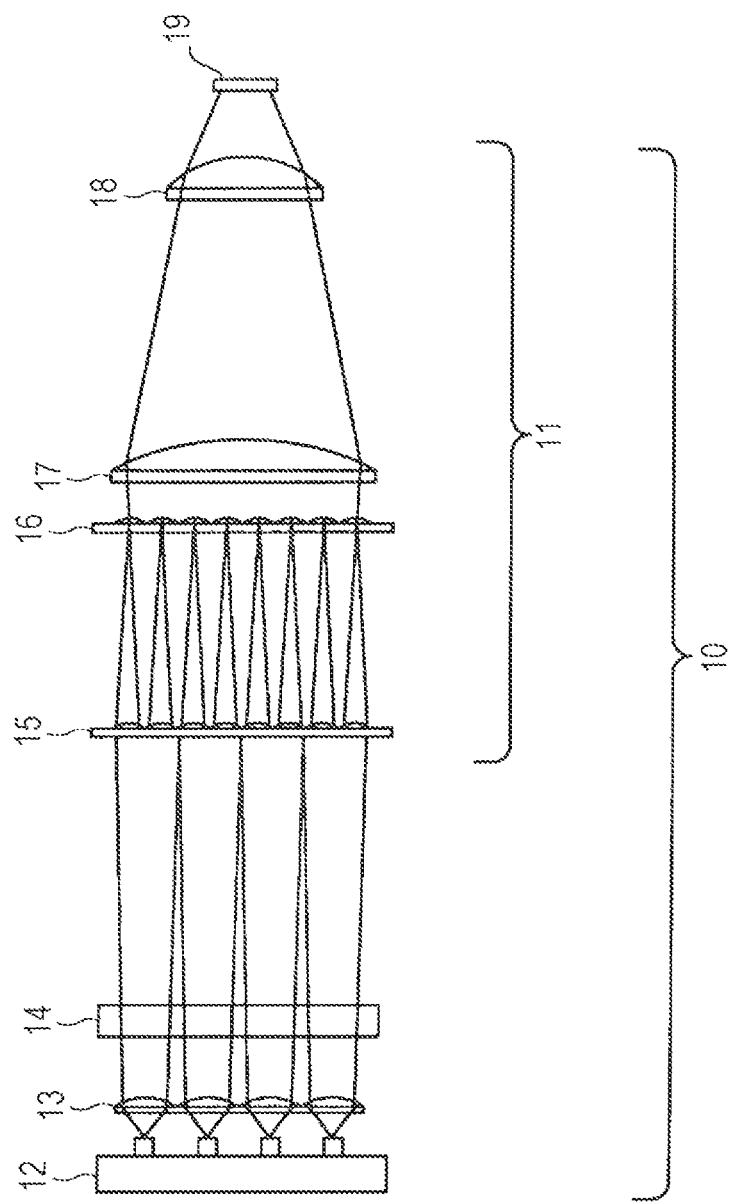
FIG. 3 illustrates an example configuration of the illumination optical system according to the first embodiment projected on a second plane.

The configuration of the illumination optical system according to the first embodiment will be described below with reference to FIGS. 2 and 3. FIG. 2 illustrates an example configuration of the illumination optical system according to the first embodiment projected on a first plane. FIG. 3 illustrates an example configuration of the illumination optical system according to the first embodiment projected on a second plane. On the first plane, the y direction is defined as a direction of an axis on the plane of which the optical axis of the light source is the normal line, and the x direction is defined as the direction of an axis orthogonal to the y direction. The first plane is defined by the x axis, which extends from the bottom to top of the drawing, and the y axis, which is extends orthogonally from the back to front of the drawing. The second plane is defined by the y axis, which extends from the bottom to top of the drawing and the x axis, which extends orthogonally from the front to back of the drawing.

An illumination optical system 10 includes a two-dimensional laser-array light source 12 that does not correspond to a specific color (wavelength). The illumination optical system 10 has the same configuration as the illumination optical systems 10R, 10G, and 10B, and the description of the illumination optical system 10 also corresponds to the illumination optical systems 10R, 10G, and 10B.

The illumination optical system 10 (illumination optical apparatus) includes the two-dimensional laser-array light source 12, first lenses 13, second lenses 14, and an integrator optical system 11. In the illumination optical system 10, light from the integrator optical system 11 is incident on a light modulation device 19.

The two-dimensional laser-array light source 12 has a plurality of single-laser light sources arranged in a two-dimensional array on a plane. For example, the two-dimensional laser-array light source 12 has m×n single-laser light sources arranged in a two-dimensional array (matrix) of m rows and n columns.

A single-laser light source has a predetermined divergence angle (beam spread angle) to the optical axis and has a large divergence angle in a specific direction. The two-dimensional laser-array light source 12 includes a plurality of single-laser light sources aligned in a specific direction. Thus, the two-dimensional laser-array light source 12 also has a predetermined divergence angle to the optical axis and has a large divergence angle in the specific direction. Here, the specific direction is the y direction.

In the illumination optical system 10, the first lenses 13 are disposed parallel to the surface of the two-dimensional laser-array light source 12 on which the single-laser light sources are disposed. The first lenses 13 are constituted of cylindrical lenses.

The first lenses 13, which are aligned in the y direction, correspond to columns of the single-laser light sources aligned in the x direction. The first lenses 13 are fast-axis-collimator (FAC) lenses that collimate the fast axis components of the incident light and convert the fast axis components to quasi-parallel light (light not completely collimated).

The first lenses 13 convert the light from the two-dimensional laser-array light source 12 to quasi-parallel light of which the divergence angle is mainly limited in the y direction (first axis direction of the two-dimensional array).

Here, the quasi-parallel light has a divergence angle in which the light incident on the incident surface of the integrator optical system 11 is superposed in the y direction. The first lenses 13 are defocused such that the focal positions are a predetermined distance from the two-dimensional laser-array light source 12. In this way, the first lenses 13 convert the emitted light to quasi-parallel light in the y direction.

In the illumination optical system 10, the second lenses 14 are disposed parallel to the surface of the two-dimensional laser-array light source 12 on which the single-laser light sources are disposed. The second lenses 14 are disposed rearward of the first lenses 13 (closer to the integrator optical system 11). The second lenses 14 are constituted of cylindrical lenses.

The second lenses 14, which are aligned in the x direction, correspond to columns of the single-laser light sources in the y direction. The second lenses 14 are slow-axis-collimator (SAC) lenses that collimate the slow axis components of the incident light and convert the slow axis components to quasi-parallel light.

The second lenses 14 convert the light from the two-dimensional laser-array light source 12 to quasi-parallel light of which the divergence angle is mainly limited in the x direction (second axis direction of the two-dimensional array).

Here, the quasi-parallel light has a divergence angle in which the light incident on the incident surface of the integrator optical system 11 is superposed in the x direction. The second lenses 14 are defocused such that the focal positions are a predetermined distance from the two-dimensional laser-array light source 12. In this way, the second lenses 14 convert the emitted light to quasi-parallel light in the x direction.

The integrator optical system 11 includes first fly-eye lenses 15, second fly-eye lenses 16, a condenser lens 17, and a field lens 18. The light emitted from the two-dimensional laser-array light source 12, which is converted to partly superposed quasi-parallel light by the first lenses 13 and the second lenses 14, is incident on the first fly-eye lenses 15 in the integrator optical system 11. Thus, the integrator optical system 11 is disposed at a predetermined distance from the second lenses 14 such that the light from the second lenses 14 is partly superposed.

The light incident on the first fly-eye lenses 15 is divided in the integrator optical system 11 and is superposed on the incident surface. The light from the field lens 18 in the integrator optical system 11 is incident on the light modulation device 19, which is an irradiated surface.

The first fly-eye lenses 15 and the second fly-eye lenses 16 make the illuminance of the incident quasi-parallel light uniform. The light from the second fly-eye lenses 16 incident on the condenser lens 17 is transmitted through the field lens 18 and is incident on the light modulation device 19.

In this way, in the illumination optical system 10, the divergence angle of the light from the two-dimensional laser-array light source 12 is decreased in the y direction by the first lenses 13 and then decreased in the x direction by the second lenses 14. The quasi-parallel light from the first lenses 13 and the second lenses 14 is partly superposed in the x and y directions and is incident on the integrator optical system 11.

The light beams emitted from the two-dimensional laser-array light source 12 are linearly polarized light beams. The polarization direction of the light beams from the two-dimensional laser-array light source 12 matches the polarization direction of the light modulation device 19 that is constituted of a reflective liquid crystal display device (reflective liquid crystal display apparatus) or a transmissive liquid crystal device (transmissive liquid crystal display apparatus). In this way, the illumination optical system 10 maintains the polarization direction of the two-dimensional laser-array light source 12 and is capable of maintaining high light usage efficiency without adding devices such as a P/S conversion element.

In such a case, the polarization ratio of the two-dimensional laser-array light source 12 is preferably ten or more. That is, the P or S component, whichever is the main polarization component, is ten or more when the other component, which is the sub polarization component, is one. More preferably, the polarization ratio of the two-dimensional laser-array light source 12 is 20 or more. That is, the P or S component, whichever is the main polarization component, is 20 or more when the other component, which is the sub polarization component, is one. When a preferable polarization ratio is not achieved, the optical efficiency of the illumination optical system 10 can be improved by using a P/S conversion element.

Figure 4:
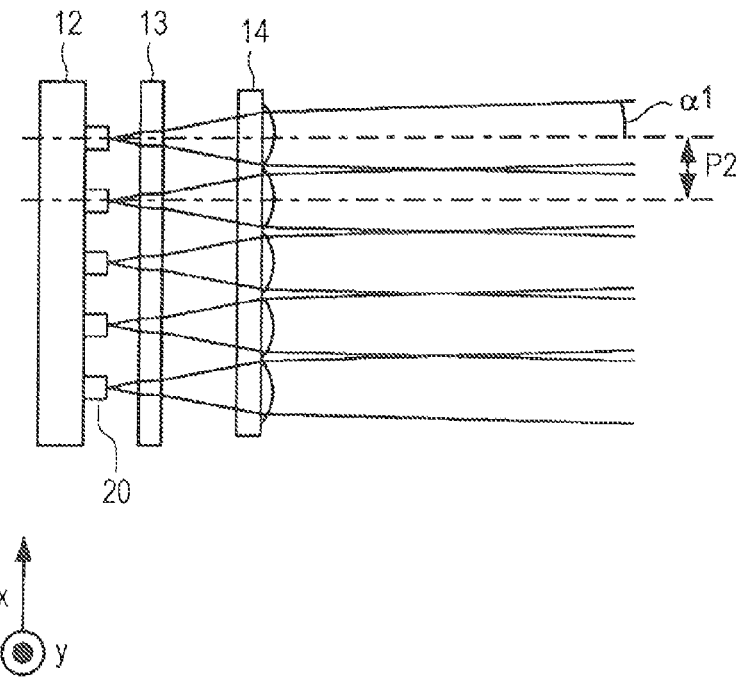
FIG. 4 illustrates light emitted from a two-dimensional laser-array light source according to the first embodiment projected on the first plane.
Figure 5:
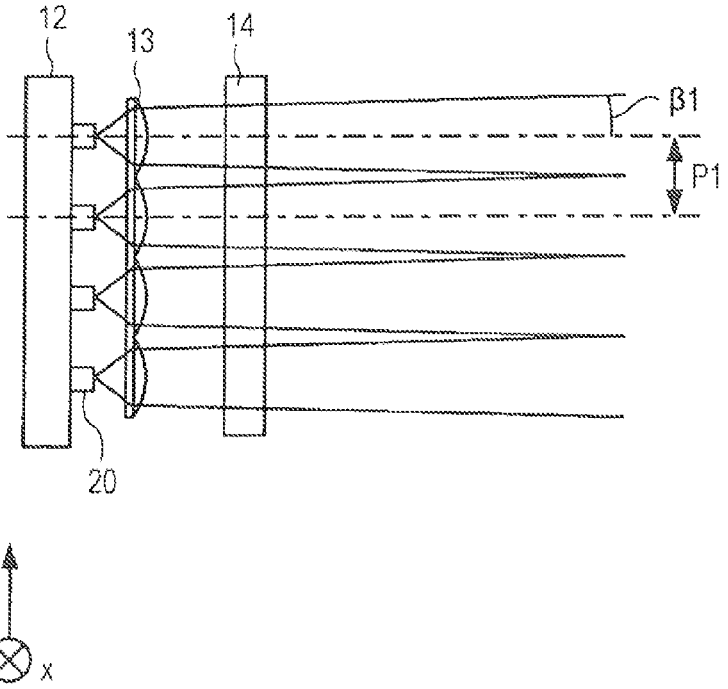
FIG. 5 illustrates light emitted from the two-dimensional laser-array light source according to the first embodiment projected on the second plane.

The configuration of the illumination optical system according to the first embodiment will be described below with reference to FIGS. 4 and 5. FIG. 4 illustrates light emitted from the two-dimensional laser-array light source according to the first embodiment projected on the first plane. FIG. 5 illustrates light emitted from the two-dimensional laser-array light source according to the first embodiment projected on the second plane.

The two-dimensional laser-array light source 12 includes a two-dimensional array of single-laser light sources 20 arranged in a pitch P1 (distance P1) in the y direction and a pitch P2 (distance P2) in the x direction. The single-laser light sources 20 of the two-dimensional laser-array light source 12 are arranged such that the divergence angle is large in the y direction.

The single-laser light sources 20 are arranged in the pitch P2, which is smaller than the pitch P1, in the x direction to constitute a one-dimensional laser-array light source. The one-dimensional laser-array light source and the corresponding first lenses 13 constitute a one-dimensional laser-array unit. A plurality of one-dimensional laser-array units is arranged in the pitch P1 in the y direction, constituting a two-dimensional array of the single-laser light sources 20.

The second lenses 14 are disposed rearward of the two-dimensional laser-array light source 12 and constitute a two-dimensional laser-array unit. The two-dimensional laser-array light source 12 includes one or more two-dimensional laser-array units, depending on the desired amount of light.

The light emitted from the two-dimensional laser-array light source 12 is converted to quasi-parallel light that has a divergence angle $\beta 1$ in the y direction by the first lenses 13 and a divergence angle $\alpha 1$ in the x direction by the second lenses 14 and is incident on the integrator optical system 11.

With the illumination optical system 10 having such a configuration, when the number of devices (single-laser light sources 20) in the two-dimensional laser-array light source 12 is increased, the devices can be easily arranged in the direction having a large divergence angle. In the illumination optical system 10, quasi-parallel light can be generated from any one of the devices arranged in a two-dimensional array on the arrangement surface of the two-dimensional laser-array light source 12 by the first lenses 13 and the second lenses 14. Thus, the illumination optical system 10 can easily allow an increase in the number of devices.

Even when the number of the single-laser light sources 20 is increased in order to increase the amount of generated light, the illumination optical system 10 can be designed with a small size. The two-dimensional laser-array light source 12 has a reduced size by arranging the single-laser light sources 20 in a two-dimensional array such that the number of single-laser light sources 20 in the y direction in which the divergence angle is large is less than the number of single-laser light sources 20 in the x direction in which the divergence angle is small.

With the illumination optical system 10, even with the increased number of devices in the two-dimensional laser-array light source 12, the integrator optical system can easily take in illumination light from devices positioned at the periphery and away from the center region of the two-dimensional array surface in such a manner similar to taking in illumination light from the devices positioned in the center region.

The illumination optical system 10 has a reduced size by disposing the first lenses 13 closer to the light source than the second lenses 14 and by first converting the light from the two-dimensional laser-array light source 12 in the y direction, which has a larger divergence angle, to quasi-parallel light.

Figure 6:
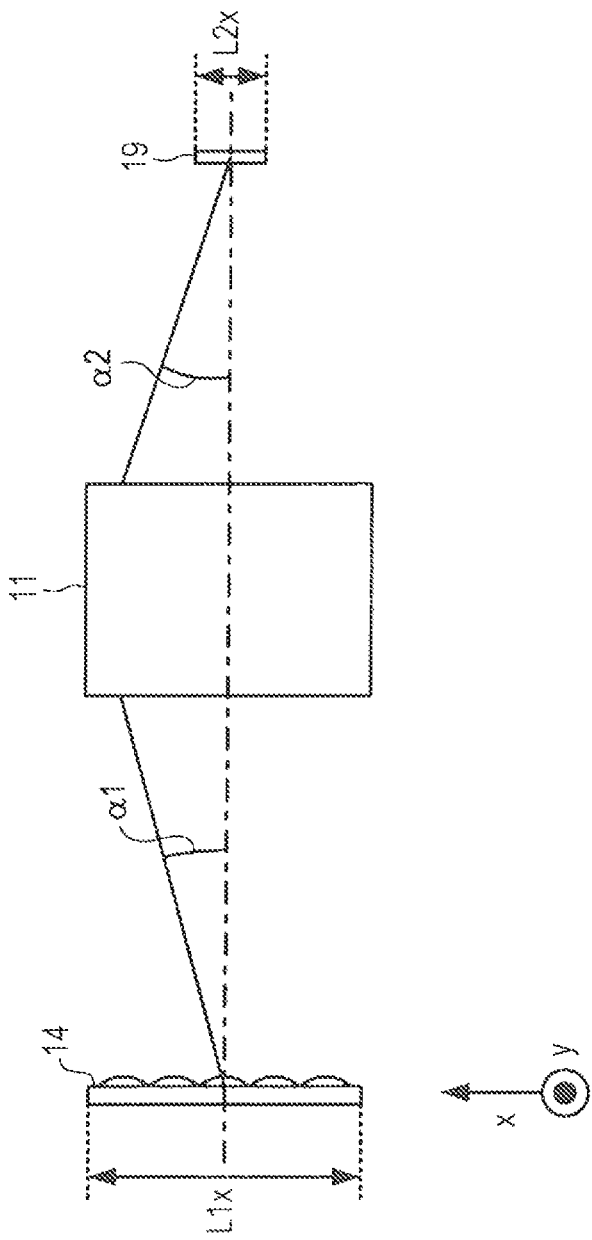
FIG. 6 illustrates the relationship between light incident on and light emitted from an integrator optical system of the illumination optical system according the first embodiment projected on the first plane.
Figure 7:
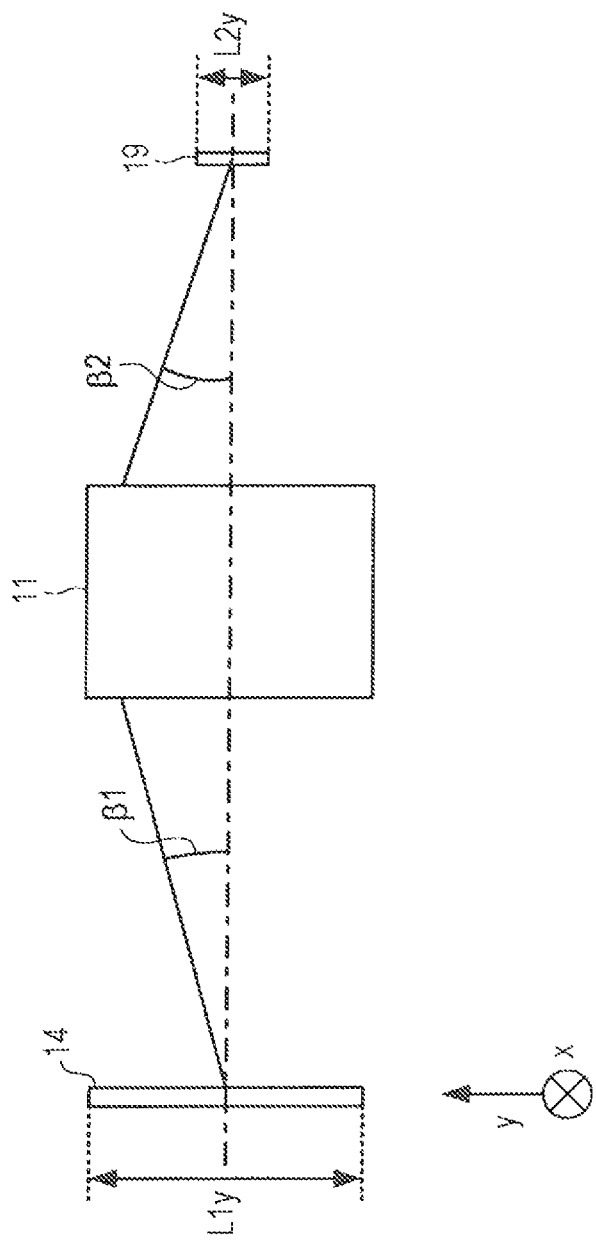
FIG. 7 illustrates the relationship between light incident on and light emitted from the integrator optical system of the illumination optical system according the first embodiment projected on the second plane.

The relationship between the light incident on and the light emitted from the integrator optical system 11 according the first embodiment will be described below with reference to FIGS. 6 and 7. FIG. 6 illustrates the relationship between the light incident on and the light emitted from the integrator optical system in the illumination optical system according the first embodiment projected on the first plane. FIG. 7 illustrates the relationship between the light incident on and the light emitted from the integrator optical system in the illumination optical system according the first embodiment projected on the second plane.

In the projection on the first plane, the light emitted from the second lenses 14 at a divergence angle $\alpha 1$ is incident on the integrator optical system 11 and is then incident on the light modulation device 19 at an acceptance angle $\alpha 2$. At this time, the integrator optical system 11 takes in light from the emission surface of the second lenses 14, whose length in the x direction is L1x, and irradiates the irradiated surface of the light modulation device 19, whose length in the x direction is L2x.

Similarly, in the projection on the second plane, the light emitted from the second lenses 14 at a divergence angle $\beta 1$ is incident on the integrator optical system 11 and is then incident on the light modulation device 19 at an acceptance angle $\beta 2$. At this time, the integrator optical system 11 takes in light from the emission surface of the second lenses 14, whose length in the y direction is L1y, and irradiates the irradiated surface of the light modulation device 19, whose length in the y direction is L2y.

The divergence angles $\alpha 1$ and $\beta 1$ are determined on the basis of the size of the, emitting regions, installation accuracy, and the amount of defocusing of the single-laser light sources 20.

The relationship among L1x, L1y, $\alpha 1$, $\alpha 2$, L2x, L2y, $\beta 1$, and $\beta 2$ is represented by Expressions (1) and (2) using Helmholtz-Lagrange invariant.

$$k1 \cdot L1x \cdot \alpha 1 = L2x \cdot \alpha 2 \quad (1)$$

$$k2 \cdot L1y \cdot \beta 1 = L2y \cdot \beta 2 \quad (2)$$

where k1 and k2 are coefficients representing the relationship between the light emitted from the second lenses 14 and the light taken in by the integrator optical system 11.

The coefficients k1 and k2 are preferably within the range of 0.5 to 1.5. For example, coefficients of 0.5 or less indicate that the integrator optical system 11 does not use 50% or more of the light. A coefficient ratio of 1.5 or more indicates that the integrator optical system 11 is designed with excessive redundancy.

Thus, the illumination optical system 10 is suitably designed when Expressions (1) and (2) are satisfied, where $0.5 \leq k1 \leq 1.5$ and $0.5 \leq k2 \leq 1.5$. The coefficients k1 and k2 may be equal.

In this way, in the illumination optical system 10, the usage efficiency of the beams can be optimized by controlling the divergence angles of the beams in accordance with the acceptance angle of the integrator optical system 11. In the illumination optical system 10, uniformity of the irradiated surface can be achieved by increasing the degree of superposition of the light incident on the integrator optical system 11.

Figure 8:
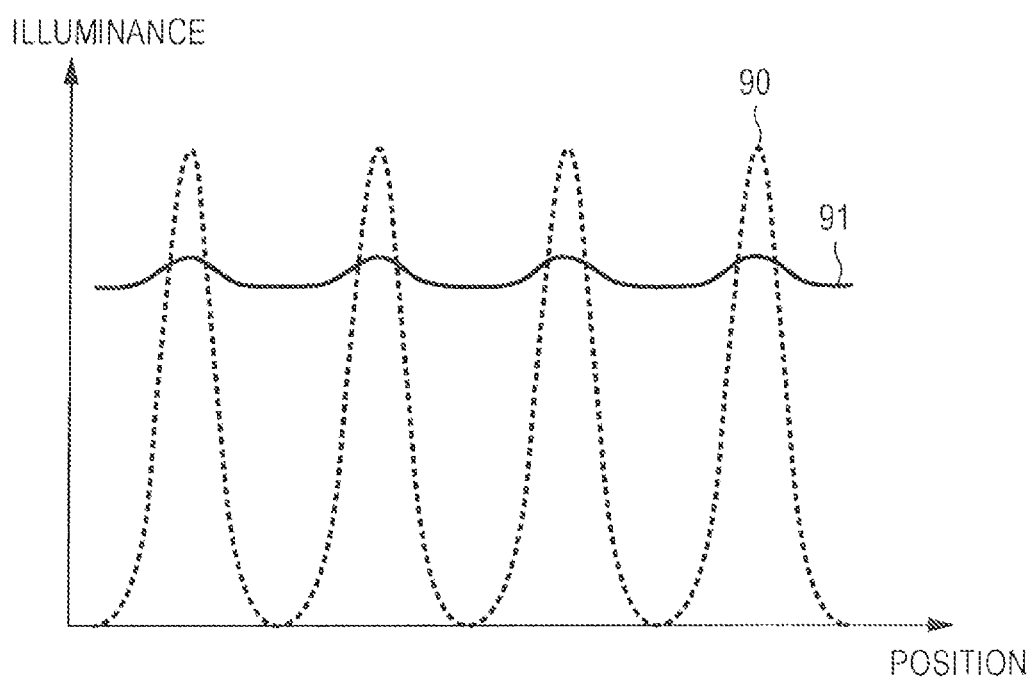
FIG. 8 illustrates the illuminance distribution of beams emitted from the illumination optical system according to the first embodiment incident on an incident surface.

The illuminance distribution of the beams from the illumination optical system 10 according to the first embodiment and incident on the incident surface will be described below with reference to FIG. 8. FIG. 8 illustrates the illuminance distribution of the beams from the illumination optical system according to the first embodiment and incident on an incident surface.

The graph in FIG. 8 depicts the illuminance distribution 91 (solid line) of the beams from the illumination optical system 10 and incident on the incident surface and the illuminance distribution 90 (dotted line) of an illumination optical system according to a comparative example, where the horizontal axis represents the position on the incident surface and the vertical axis represents the illuminance.

The illuminance distribution 90 according to the comparative example represents a case in which light from the two-dimensional laser-array light source is taken in to the illumination optical system as parallel light, and the illuminance distribution is not uniform because uniformity of the light sources is not sufficiently achieved. The illuminance distribution 91 of the illumination optical system 10 represents an entirely uniform illuminance distribution in which uniformity of the light sources is achieved.

In this way, light beams having illuminance made uniform by the integrator optical system 11 can be emitted from the image display apparatus 10 to the surface to be irradiated. In the illumination optical system 10, even when the two-dimensional laser-array light source 12 is set to emit a large amount of light, the divergence angle does not become excessively large, and the divergence angle and the acceptance angle of the integrator optical system 11 can be balanced by controlling the divergence angles in the x and y directions. In this way, the illumination optical system 10 reduces the loss in optical efficiency and generates sufficiently uniform illumination light. The illumination optical system 10 achieves high optical efficiency by maintaining the polarization direction of the two-dimensional laser-array light source 12 and emitting light to irradiate the irradiated surface.

Second Embodiment

Figure 9:
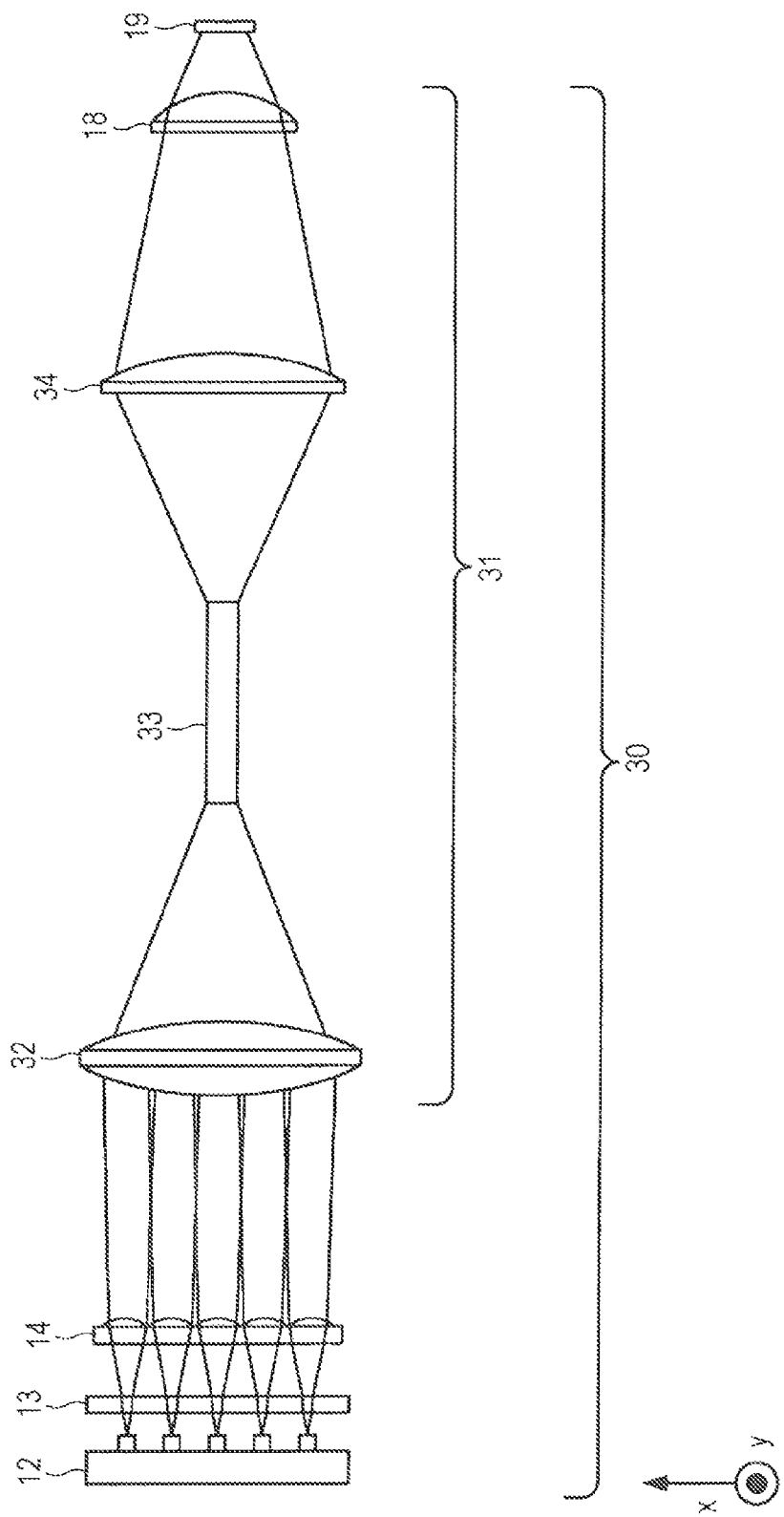
FIG. 9 illustrates an example configuration of an illumination optical system according to a second embodiment projected on the first plane.
Figure 10:
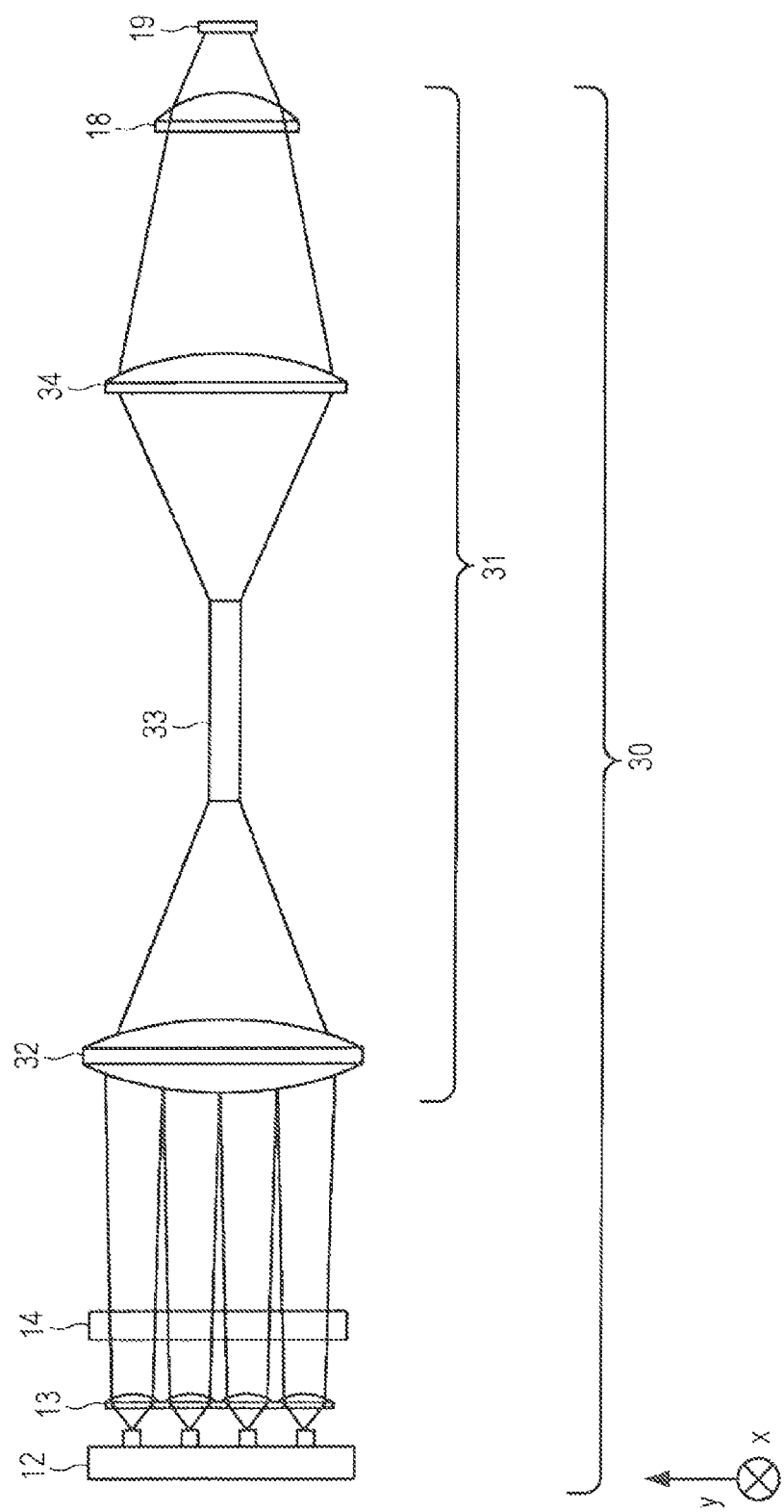
FIG. 10 illustrates an example configuration of the illumination optical system according to the second embodiment projected on the second plane.

The configuration of an illumination optical system according to a second embodiment will be described below with reference to FIGS. 9 and 10. FIG. 9 illustrates an example configuration of the illumination optical system according to the second embodiment projected on the first plane. FIG. 10 illustrates an example configuration of the illumination optical system according to the second embodiment projected on the second plane. In the description of the second embodiment, configurations similar to those in the first embodiment are designated by the same reference numerals, and duplicated description is omitted. The definitions of the x direction, y direction, first plane, and second plane are the same as those in the first embodiment.

Similar to the illumination optical system 10 according to the first embodiment, an illumination optical system 30 includes a two-dimensional laser-array light source 12 that does not correspond to a particular color.

The illumination optical system 30 (illumination optical apparatus) includes the two-dimensional laser-array light source 12, first lenses 13, second lenses 14, and an integrator optical system 31. In the illumination optical system 30, light emitted from the integrator optical system 31 is incident on a light modulation device 19.

The integrator optical system 31 includes a condenser lens 32, a rod lens 33, a condenser lens 34, and a field lens 18. In the integrator optical system 31, the light emitted from the two-dimensional laser-array light source 12 and converted to quasi-parallel light by the first lenses 13 and the second lenses 14 is incident on the rod lens 33 through the condenser lens 32. The light from the two-dimensional laser-array light source 12 is partly superposed (defocused) and is incident on the incident surface of the rod lens 33. Thus, the integrator optical system 31 is a predetermined distance from the second lenses 14 such that the light emitted from the second lenses 14 is partly superposed.

The light incident on the rod lens 33 is superposed by the rod lens 33 to make the illuminance uniform. The condenser lens 34 receives light from the rod lens 33 and emits the received light to the light modulation device 19 through the field lens 18.

In this way, in the illumination optical system 30, the divergence angle in the y direction of the light emitted from the two-dimensional laser-array light source 12 is decreased by the first lenses 13 and then the divergence angle in the x direction is decreased by the second lenses 14. The quasi-parallel light emitted from the first lenses 13 and second lenses 14 is partly superposed in the x and y directions and is then incident on the integrator optical system 31.

The polarization direction of the two-dimensional laser-array light source 12 matches the polarization direction of the light modulation device 19 that is constituted of a reflective liquid-crystal-display device (reflective liquid-crystal-display apparatus) or a transmissive liquid-crystal device (transmissive liquid-crystal-display apparatus). In this way, the illumination optical system 30 maintains the polarization direction of the two-dimensional laser-array light source 12 and is capable of maintaining high light usage efficiency without adding devices such as a P/S conversion element.

Similar to the first embodiment, the illumination optical system 30 is suitably designed when Expressions (1) and (2) are satisfied, where $0.5 \leq k1 \leq 1.5$ and $0.5 \leq k2 \leq 1.5$.

With the illumination optical system 30 having such a configuration, when the number of devices (single-laser light sources 20) in the two-dimensional laser-array light source 12 is increased, the devices can be easily arranged in the direction having a large divergence angle. In the illumination optical system 30, quasi-parallel light can be generated from any one of the devices arranged in a two-dimensional array on the arrangement surface of the two-dimensional laser-array light source 12 by the first lenses 13 and the second lenses 14. Thus, the illumination optical system 30 can easily allow an increase in the number of devices. Since the first lenses 13 and the second lenses 14 correspond to every one of the devices arranged in a two-dimensional array on the arrangement surface of the two-dimensional laser-array light source 12 in the illumination optical system 30, spherical aberration of the first lenses 13 and the second lenses 14 can be suppressed.

Even when the number of single-laser light sources 20 is increased in order to increase the amount of generated light, the illumination optical system 30 can be designed with a small size.

With the illumination optical system 30, even with an increased number of devices in the two-dimensional laser-array light source 12, the integrator optical system can easily take in illumination light from the devices positioned at the periphery and away from the center region of the two-dimensional array surface in such a manner similar to taking in illumination light from the devices positioned in the center region.

The illumination optical system 30 has a reduced size by disposing the first lenses 13 closer to the light source than the second lenses 14 and by first converting the light from the two-dimensional laser-array light source 12 in the y direction, which has a larger divergence angle, to quasi-parallel light.

Third Embodiment

Figure 11:
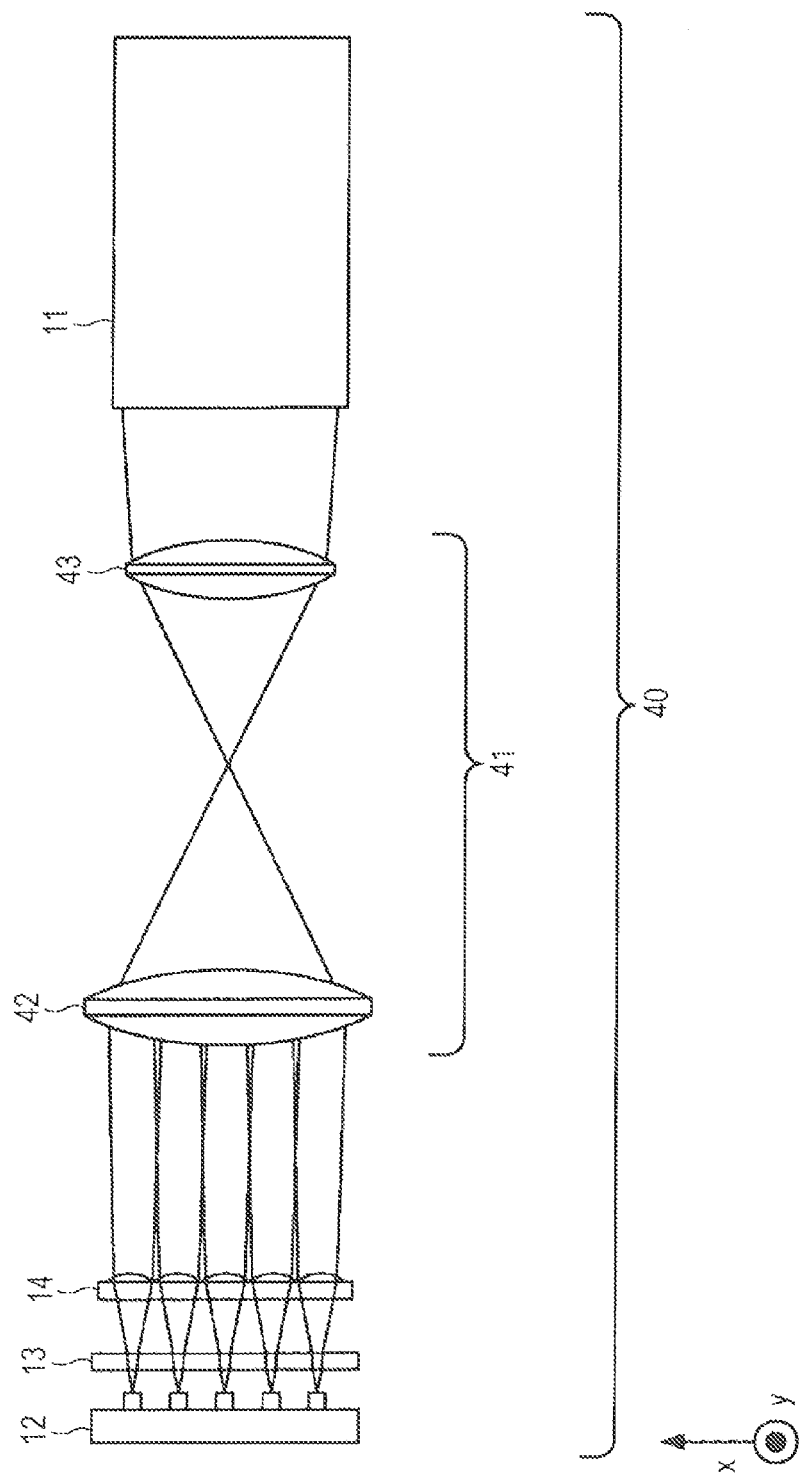
FIG. 11 illustrates an example configuration of an illumination optical system according to a third embodiment projected on the first plane.

The configuration of an illumination optical system according to a third embodiment will be described below with reference to FIG. 11. FIG. 11 illustrates an example configuration of the illumination optical system according to the third embodiment projected on the first plane. In the description of the third embodiment, configurations similar to those in the first embodiment are designated by the same reference numerals, and duplicated description is omitted. The definitions of the x direction, y direction, and first plane are the same as those in the first embodiment.

Similar to the illumination optical system 10 according to the first embodiment, an illumination optical system 40 includes a two-dimensional laser-array light source 12 that does not correspond to a particular color.

The illumination optical system 40 (illumination optical apparatus) includes the two-dimensional laser-array light source 12, first lenses 13, second lenses 14, a relay optical system 41, and an integrator optical system 11. In the illumination optical system 40, light emitted from the integrator optical system 11 is incident on an irradiated surface. The illumination optical system 40 may include the integrator optical system 31 instead of the integrator optical system 11.

The relay optical system 41 includes a first relay lens 42 and a second relay lens 43. In the illumination optical system 40, the size (area) of the two-dimensional laser-array light source 12 can be set arbitrarily to match the size of an optical device (for example, first fly-eye lenses 15) constituting the integrator optical system 11 because the light from the second lenses 14 passes through the relay optical system 41.

In this way, the relay optical system 41 of the image display apparatus 40 increases flexibility in the combinations of the two-dimensional laser-array light source 12 and the integrator optical system 11.

The present technique may also be provided as the following configurations:

(1) an illumination optical system including
a two-dimensional laser-array light source including a plurality of laser light sources arranged in a two-dimensional array on a plane; an integrator optical system configured to superpose incident light and emit the light to an irradiated surface; a plurality of first lenses disposed parallel to the plane and configured to superpose beams from the two-dimensional laser-array light source in a first axis direction and emit the beams to the integrator optical system while limiting a divergence angle in the first axis direction of the two-dimensional array; and a plurality of second lenses disposed rearward of the first lenses and configured to superpose the beams from the two-dimensional laser-array light source in a second axis direction orthogonal to the first axis direction and emit the beams to the integrator optical system while limiting a divergence angle in the second axis direction;

(2) the illumination optical system according to (1), wherein, for the beams emitted from the second lenses in both the first axis direction and the second axis direction, the product of the length of an emission area and a divergence angle is equal to the product of the length of an irradiated area on the irradiated surface and an acceptance angle multiplied by a value within a range of 0.5 to 1.5, inclusive;

(3) the illumination optical system according to (1) or (2), wherein, the first lenses and the second lenses are constituted of cylindrical lenses;

(4) the illumination optical system according to one of (1) to (3), wherein the beams from the two-dimensional laser-array light source are linearly polarized light, and a ratio of a polarization component of the linearly polarized light to a polarization component in a direction orthogonal to the linearly polarized light is ten or more;

(5) the illumination optical system according to one of (1) to (4), wherein the laser light sources of the two-dimensional laser-array light source are arranged in a first pitch in the first axis direction and are arranged in a second pitch smaller than the first pitch in the second axis direction;

(6) the illumination optical system according to one of (1) to (5), wherein the integrator optical system includes a first fly-eye lens, a second fly-eye lens disposed rearward of the first fly-eye lens, and a lens group disposed rearward of the second fly-eye lens;

(7) the illumination optical system according to one of (1) to (5), wherein the integrator optical system includes a rod lens, a forward lens disposed forward of the rod lens, and a rearward lens disposed rearward of the rod lens;

(8) the illumination optical system according to one of (1) to (7), further including a relay optical system configured to relay light from the second lenses to the integrator optical system;

(9) an image display apparatus including a light modulation device; a two-dimensional laser-array light source including a plurality of laser light sources arranged in a two-dimensional array on a plane; an integrator optical system configured to superpose incident light and emit the light to the light modulation device; a plurality of first lenses disposed parallel to the plane and configured to superpose beams from the two-dimensional laser-array light source in a first axis direction and emit the beams to the integrator optical system while limiting a divergence angle in the first axis direction of the two-dimensional array; and a plurality of second lenses disposed rearward of the first lenses and configured to superpose the beams from the two-dimensional laser-array light source in a second axis direction orthogonal to the first axis direction and emit the beams to the integrator optical system while limiting a divergence angle in the second axis direction; and

(10) the image display apparatus according to (9), wherein a reflective liquid-crystal-display apparatus serves as the light modulation device, and the polarization direction of the two-dimensional laser-array light source matches the polarization direction of the reflective liquid-crystal-display apparatus.

Various modifications are possible to the embodiments described above without departing from the scope of the technique.

Furthermore, various modifications and changes by one skilled in the art are possible to the embodiments described above, and the embodiments are not limited to the accurate configurations and applications described above.

The present disclosure contains subject matter related to that disclosed in Japanese Priority Patent Application JP 2011-150077 filed in the Japan Patent Office on Jul. 6, 2011, the entire contents of which are hereby incorporated by reference.

What is claimed is:
1. An illumination optical system comprising:
a two-dimensional laser-array light source including a plurality of laser light sources arranged in a two-dimensional array on a plane;
an integrator optical system configured to superpose incident light and emit the light to an irradiated surface:
a plurality of first lenses disposed parallel to the plane and configured to superpose beams from the two-dimensional laser-array light source in a first axis direction and emit the beams to the integrator optical system while limiting a divergence angle in the first axis direction of the two dimensional array; and
a plurality of second lenses disposed rearward of the first lenses and configured to superpose the beams from the two-dimensional laser-array light source in a second axis direction orthogonal to the first axis direction and emit the beams to the integrator optical system while limiting a divergence angle in the second axis direction,
wherein, for the beams emitted from the second lenses in both the first axis direction and the second axis direction, the product of the length of an emission area and a divergence angle is equal to the product of the length of an irradiated area on the irradiated surface and an acceptance angle multiplied by a value within, a range of 0.5 to 1.5, inclusive.

2. The illumination optical system according to claim 1, wherein, the first lenses and the second lenses are cylindrical lenses.

3. The illumination optical system according to claim 1, wherein
the beams from the two-dimensional laser-array light source are linearly polarized light, and
a ratio of a polarization component of the linearly polarized light to a polarization component in a direction orthogonal to the linearly polarized light is ten or more.

4. The illumination optical system according to claim 1, wherein the laser light sources of the two-dimensional laser-array light source are arranged in a first pitch in the first axis direction and are arranged in a second pitch smaller than the first pitch in the second axis direction.

5. The illumination optical system according to claim 1, wherein the integrator optical system includes:
a first fly-eye lens;
a second fly-eye lens disposed rearward of the first fly-eye lens; and
a lens group disposed rearward of the second fly-eye lens.

6. The illumination optical system according to claim 1, wherein the integrator optical system includes:
a rod lens;
a forward lens disposed forward of the rod lens; and
a rearward lens disposed rearward of the rod lens.

7. The illumination optical system according to claim 1, further comprising:
a relay optical system configured to relay light from the second lenses to the integrator optical system.

8. An image display apparatus comprising:
a light modulation device including a reflective liquid-crystal-display apparatus exhibiting a polarization direction;
a two-dimensional laser-array light source exhibiting a polarization direction and including a plurality of laser light sources arranged in a two-dimensional array on a plane, the polarization direction of the two-dimensional laser-array light source matches the polarization direction of the reflective liquid-crystal-display apparatus;
an integrator optical system configured to superpose incident light and emit the light to the light modulation device;
a plurality of first lenses disposed parallel to the plane and configured to superpose beams from the two-dimensional laser-array light source in a first axis direction and emit the beams to the integrator optical system while limiting a divergence angle in the first axis direction of the two-dimensional array; and a plurality of second lenses disposed rearward of the first lenses and configured to superpose the beams from the two-dimensional laser-array light source in a second axis direction orthogonal to the first axis direction and emit the beams to the integrator optical system while limiting a divergence angle in the second axis direction.

* * * * *